(12) United States Patent
Hsu et al.

(10) Patent No.: US 8,470,503 B2
(45) Date of Patent: Jun. 25, 2013

(54) PHOTOSENSITIVE RESIN COMPOSITION FOR COLOR FILTER AND COLOR FILTER USING SAME

(75) Inventors: Jung Pin Hsu, Tainan (TW); Bo Hsuan Lin, Tainan (TW)

(73) Assignee: Chi Mei Corporation, Tainan (TW)

( * ) Notice: Subject to any disclaimer, the term of this patent is extended or adjusted under 35 U.S.C. 154(b) by 315 days.

(21) Appl. No.: 12/929,880

(22) Filed: Feb. 23, 2011

(65) Prior Publication Data

US 2011/0228201 A1 Sep. 22, 2011

(30) Foreign Application Priority Data

Mar. 22, 2010 (TW) ................ 99108447 A

(51) Int. Cl.
*G02B 5/20* (2006.01)
*G03F 1/1335* (2006.01)

(52) U.S. Cl.
USPC ............... 430/7; 430/270.1; 349/106

(58) Field of Classification Search
None
See application file for complete search history.

(56) References Cited

U.S. PATENT DOCUMENTS

2009/0246649 A1* 10/2009 Takakuwa et al. ........... 430/7
2009/0246651 A1* 10/2009 Fujimori et al. ............ 430/7

FOREIGN PATENT DOCUMENTS

| JP | 2003-161828 | | 6/2003 |
| JP | 2009-198751 | | 9/2009 |
| JP | 2009-222752 | | 10/2009 |
| JP | 2010-015062 A | * | 1/2010 |

OTHER PUBLICATIONS

Computer-generated translation of JP 2010-015062 (Jan. 2010).*

* cited by examiner

*Primary Examiner* — John A McPherson

(57) ABSTRACT

The present invention relates to a photosensitive resin composition for color filter of liquid-crystal displays, and particularly provides a photosensitive resin composition for reducing aggregation of pigment, which has superior development properties, and forms images having no undercut after development in the formation of green pixels for color filter. The composition comprises an alkali-soluble resin (A), a photopolymerizable monomer (B), a photoinitiator (C), an organic solvent (D), and a pigment (E). In which the pigment (E) comprises a halogenated phthalocyanine compound (E-1) as depicted in the undermentioned Formula (1):

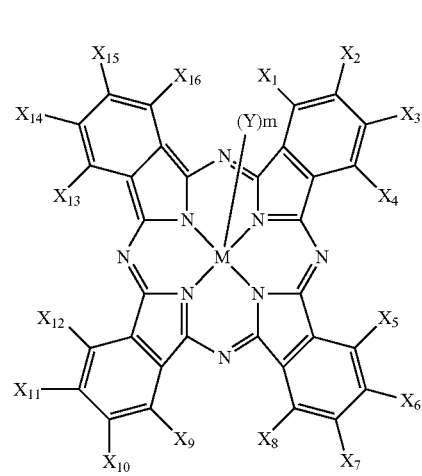

Formula (1)

wherein, M is Al, Si, Sc, Ti, V, Fe, Co, Ni, Zn, Ga, Ge, Y, Zr, Nb, In, Sn or Pb; $X_1$~$X_{16}$ are hydrogen atoms or halogen atoms, and the halogen atoms are fluorine atoms, chlorine atoms, bromine atoms or iodine atoms. The total number of halogen atoms is an integer between 8~16; Y are fluorine atoms, chlorine atoms, bromine atoms, iodine atoms, oxygen atoms or hydroxyl groups; and m is an integer between 0~2. The photoinitiator (C) comprises O-acyloxime photoinitiator (C-1) and triazine photoinitiator (C-2), and the proportion by weight of the photoinitiator (C-1) and the photoinitiator (C-2) is 20/80~80/20.

9 Claims, 3 Drawing Sheets

PHOTOSENSITIVE RESIN COMPOSITION FOR COLOR FILTER AND COLOR FILTER USING SAME

BACKGROUND OF THE INVENTION (a) Field of the Invention

The present invention relates to a photosensitive resin composition for color filter of liquid-crystal displays, and particularly provides a photosensitive resin composition for reducing aggregation of pigment, which has superior development properties, and forms images having no undercut after development in the formation of green pixels for color filter.

(b) Description of the Prior Art

Currently, the color filter is widely applied in LCDs (liquid-crystal displays), color fax machines, color cameras, etc. And the increasing demand for color LCDs in image equipment has brought about the development of more advanced technologies for manufacturing color filter.

The color filter can be manufactured by forming red, green and blue pixels on a transparent glass substrate using a dyeing method, printing method, electro-deposition method or pigment dispersion method. To increase contrast of the color filter, a black matrix is generally placed between the color pixels.

Regarding the aforementioned pigment dispersion method, the pigments are first dispersed in a photo-curable resin to produce a color photosensitive resin composition for forming a color resin layer of the pixels. Metal such as Cr or $Cr_2O_3$ or a black resin layer of the photosensitive resin is formed as a black matrix on a transparent (glass) substrate, then the photosensitive resin (color photoresist)dispersed with red pigment is coated onto the substrate. Red pixels are obtained after exposing through a photo mask and developing. The above procedures are repeated, i.e., coating, exposing and developing, to further obtain green and blue pixels.

In recent years, in addition to personal computers, LCDs are also applied in color televisions and monitors, particularly the large-sized color LCD TVs. For these applications, it is necessary to increase chroma and contrast.

Generally, the green pixels of color filter can be formed using a photosensitive resin composition adopting a halogenated phthalocyanine compound with central metal containing copper as the color pigment. However, the color pixels formed are unable to achieve the requirements for high contrast and high brightness. Hence, the Japanese Patent Publication No. 2003-161,828 disclosed adopting a halogenated phthalocyanine compound with central metal containing zinc in place of the copper.

However, when a photoinitiator, such as acetophenone disclosed in the Japanese Patent Publication No. 2009-222,752, or benzophenone disclosed in the Japanese Patent Publication No. 2009-198,751, is used in the photosensitive resin composition manufactured using the halogenated phthalocyanine compound with central metal containing zinc as a color pigment, then aggregation of pigment occurs, development properties are poor, and the problems of undercut occurs easily in the images formed after development.

SUMMARY OF THE INVENTION

The present invention relates to a photosensitive resin composition for color filter of liquid-crystal displays, and particularly provides a photosensitive resin composition for reducing aggregation of pigment, which has superior development properties, and forms images having no undercut after development in the formation of green pixels for color filter.

Another objective of the present invention lies in providing a color filter comprising a pixel layers formed by the aforementioned photosensitive resin composition.

A further objective of the present invention lies in providing a liquid display element comprising the aforementioned color filter.

In order to achieve the aforementioned objectives, the photosensitive resin composition for color filter of the present invention comprises a composition that contains an alkali-soluble resin (A), photopolymerizable monomer (B), a photoinitiator (C), an organic solvent (D), and a pigment (E), where the pigment (E) comprises a halogenated phthalocyanine compound (E-1) represented by the following Formula (1):

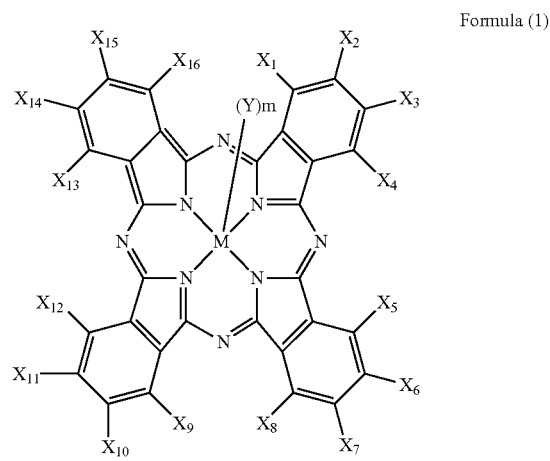

Formula (1)

wherein M is Al, Si, Sc, Ti, V, Fe, Co, Ni, Zn, Ga, Ge, Y, Zr, Nb, In, Sn or Pb; $X_1 \sim X_{16}$ are hydrogen atoms or halogen atoms, and the halogen atoms are fluorine atoms, chlorine atoms, bromine atoms or iodine atoms. The total number of halogen atoms is an integer between 8~16; Y are fluorine atoms, chlorine atoms, bromine atoms, 10 dine atoms, oxygen atoms or hydroxyl groups; and m is an integer between 0~2.

The photoinitiator (C) comprises an O-acyloxime photoinitiator (C-1) and a triazine photoinitiator (C-2), and the proportion by weight of the photoinitiator (C-1) and the photoinitiator (C-2) is 20/80~80/20.

DETAILED DESCRIPTION OF THE PREFERRED EMBODIMENTS

The following gives a detailed description of each of the compositions of the present invention:

Alkali-soluble Resin (A)

In the present invention, the alkali-soluble resin (A) comprises 5-50 parts by weight of ethylenically unsaturated monomers (a-1) containing at least one carboxyl group and 9550 parts by weight of other copolymerizable ethylenically unsaturated monomers (a-2), and the sum of the monomers (a-1) and the monomers (a-2) is 100 parts by weight.

Examples of the aforementioned ethylenically unsaturated monomers (a-1) containing at least one carboxyl group are as follows: unsaturated monocarboxylic acid, such as acrylic acid, methacrylic acid, 2-methacryloyloxyethyl succinate monoester, butenoic acid, α-chloroacrylic acid, ethacrylic acid, cinnamic acid and the like; unsaturated dicarboxylic acids (or its anhydrides), such as maleic acid, maleic anhydride, fumaric acid, itaconic acid, itaconic anhydride, citraconic acid, citraconic anhydride and the like; and unsaturated polycarboxylic acids (or its anhydrides) having at least three carboxyl groups in the molecules and the like.

Among the above, acrylic acid, methacrylic acid and 2-methacryloyloxyethyl succinate monoester are preferred. The above ethylenically unsaturated monomers (a-1) can be used alone or in admixture of two or more. In which, using the 2-acryloylethoxy succinate, 2-methylcryloyl succinate and 2-methacryloylethoxy succinate as ethylenically unsaturated monomers containing carboxylic acid groups enable increasing pigment dispersivity, improve development properties and reduce scum.

Examples of the aforementioned other copolymerizable ethylenically unsaturated monomers (a-2) are as follows: vinyl aromatic compounds, such as styrene, α-methyl styrene, o-vinyl toluene, p-vinyl toluene, p-chlorostyrene, methoxystyrene and the like; maleimide, such as N-phenylmaleimide, N-m-hydroxyphenylmaleimide, N-o-hydroxyphenylmaleimide, N-p-hydroxyphenylmaleimide, N-m-methylphenylmaleimide, N-o-methylphenylmaleimide, N-p-methylphenylmaleimide, N-m-methoxyphenylmaleimide, N-o-methoxyphenylmaleimide, N-p-methoxyphenylmaleimide, N-cyclohexylmaleimide and the like; unsaturated carboxylate, such as methyl acrylate, methyl methacrylate, ethyl acrylate, ethyl methacrylate, n-propyl acrylate, n-propyl methacrylate, iso-propyl acrylate, iso-propyl methacrylate, n-butyl acrylate, n-butyl methacrylate, iso-butyl acrylate, iso-butyl methacrylate, sec-butyl acrylate, sec-butyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, phenyl acrylate, phenyl methacrylate, methoxy triethylene glycol acrylate, methoxy triethylene glycol methacrylate, lauryl methacrylate, tetradecyl methacrylate, cetyl methacrylate, octadecyl methacrylate, eicosyl methacrylate, docosyl methacrylate and the like; unsaturated amino alkyl carboxylate, such as N,N-dimethyl aminoethyl acrylate, N,N-dimethyl aminoethyl methacrylate, N,N-diethyl aminopropyl acrylate, N,N-dimethyl aminopropyl methacrylate, N,N-dibutyl aminopropyl acrylate, N,t-butyl aminoethyl methacrylate and the like; unsaturated glycidyl carboxylate, such as glycidyl acrylate, glycidyl methacrylate and the like; vinyl carboxylate, such as vinyl acetate, vinyl propionate, vinyl butyrate, vinyl benzoic ester and the like; unsaturated ether, such as vinyl methyl ether, vinyl ethyl ether, allyl glycidyl ether, methallyl glycidyl ether and the like; vinyl cyanide, such as acrylonitrile, methyl acrylonitrile, α-chloroacrylonitrile, vinylidene cyanide and the like; unsaturated amide, such as acrylamide, methacrylamide, α-chloroacrylamide, N-hydroxyethyl acrylamide, N-hydroxyethyl methacrylamide and the like; and aliphatic conjugate diene, such as 1,3-butadiene, iso-propylene, chloroprene and the like.

Among the above, styrene, N-phenylmaleimide, methyl acrylate, methyl methacrylate, 2-hydroxyethyl acrylate, 2-hydroxyethyl methacrylate, benzyl acrylate, benzyl methacrylate are preferred. The other copolymerizable ethylenically unsaturated monomers (a-2) can be used alone or in admixture of two or more.

In the present invention, solvents used for preparing the alkali-soluble resin (A) are as follows: (poly)alkylene glycol monoalkyl ether, such as ethylene glycol monomethyl ether, ethylene glycol monoethyl ether, diethylene glycol monomethyl ether, diethylene glycol monoethyl ether, diethylene glycol n-propyl ether, diethylene glycol n-butyl ether, triethylene glycol monomethyl ether, triethylene glycol monoethyl ether, propylene glycol monomethyl ether, propylene glycol monoethyl ether, dipropylene glycol monomethyl ether, dipropylene glycol monoethyl ether, dipropylene glycol n-propyl ether, dipropylene glycol n-butyl ether, tripropylene glycol monomethyl ether, tripropylene glycol monoethyl ether and the like; (poly)alkylene glycol monoalkyl ether acetate, such as ethylene glycol monomethyl ether acetate, ethylene glycol monoethyl ether acetate, propylene glycol monomethyl ether acetate, propylene glycol monoethyl ether acetate and the like; ether, such as diethylene glycol dimethyl ether, diethylene glycol methyl ethyl ether, diethylene glycol diethyl ether, tetrahydrofuran and the like; ketone, such as methyl ethyl ketone, cyclohexanone, 2-heptanone, 3-heptanone and the like; alkyl lactate, such as methyl 2-hydroxypropionate, ethyl 2-hydroxypropionate and the like; other esters, such as methyl 2-hydroxy-2-methylpropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxy acetate, ethyl hydroxy acetate, methyl 2-hydroxy-3-methylbutyrate, 3-methyl-3-methoxybutyl acetate, 3-methyl-3-methoxybutyl propionate, ethyl acetate, n-propyl acetate, iso-propyl acetate, n-butyl acetate, iso-butyl acetate, n-amyl acetate, iso-amyl acetate, n-butyl propionate, ethyl butyrate, n-propyl butyrate, iso-propyl butyrate, n-butyl butyrate, methyl pyruvate, ethyl pyruvate, n-propyl pyruvate, methyl acetoacetate, ethyl acetoacetate, ethyl 2-oxobutyrate and the like; aromatic hydrocarbons, such as toluene, xylene and the like; and carboxylic acid amide, such as N-methyl-2-pyrrolidone, N,N-dimethylformamide, N,N-dimethylacetamide and the like.

Among the above solvents, propylene glycol monomethyl ether acetate and ethyl 3-ethoxypropionate are preferred. These solvents can be used alone or in admixture of two or more.

The initiators used for preparing the alkali-soluble resin (A) are free radical polymerization initiators, which can be exemplified as follows: azo compounds, such as 2,2'-azobisisobutyronitrile, 2,2'-azobis-(2,4-dimethylvaleronitrile), 2,2'-azobis-(4-methoxy-2,4-dimethylvaleronitrile), 2,2'-azobis-2-methyl butyronitrile and the like; and peroxide, such as benzoyl peroxide and the like.

Photopolymerizable Monomer (B)

The dosage of the photopolymerizable monomer (B) used in the present invention is generally 10~500 parts by weight, preferably 30~400 parts by weight, and more preferably 50~300 parts by weight, based on 100 parts by weight of the alkali-soluble resin (A).

The photopolymerizable monomer (B) refers to photopolymerizable monomer having at least one ethylenically unsaturated group.

In which, the photopolymerizable monomer having one ethylenically unsaturated group can be exemplified as follows: acrylamide, (meth)acryloylmorpholine, 7-amino-3,7-dimethyloctyl(meth)acrylate, iso-butoxymethyl(meth)acrylamide, iso-bornyloxyethyl(meth)acrylate, iso-bornyl(meth)acrylate, 2-ethylhexyl(meth)acrylate, ethyl diethylene glycol (meth)acrylate, t-octyl(meth)acrylamide, diacetone(meth)acrylamide, dimethylaminoethyl(meth)acrylate, dodecyl (meth)acrylate, dicyclopentenyloxyethyl(meth)acrylate, dicyclopentenyl(meth)acrylate, N,N-dimethyl(meth)acrylamide, tetrachlorophenyl(meth)acrylate, 2-tetrachlorophenoxy ethyl(meth)acrylate, tetrahydrofurfuryl(meth)acrylate, tetrabromophenyl(meth)acrylate, 2-tetrabromophenoxyethyl (meth)acrylate, 2-trichlorophenoxyethyl(meth)acrylate, tribromophenyl(meth)acrylate, 2-tribromophenoxyethyl(meth) acrylate, 2-hydroxyethyl(meth)acrylate, 2-hydroxypropyl (meth)acrylate, vinylcaprolactam, N-vinylpyrrolidone, phenoxyethyl(meth)acrylate, pentachlorophenyl(meth)acrylate, pentabromophenyl(meth)acrylate, polyethylene glycol mono(meth)acrylate, polypropylene glycol mono(meth) acrylate and bornyl(meth)acrylate.

The photopolymerizable monomer having 2 or more than 2 ethylenically unsaturated groups can be exemplified as follows: ethylene glycol di(meth)acrylate, dicyclopentenyl di(meth)acrylate, triethlene glycol diacrylate, tetraethylene glycol di(meth)acrylate, tri(2-hydroxyethyl) isocyanate di(meth)acrylate, tri(2-hydroxyethyl) isocyanate tri(meth) acrylate, caprolactone-modified tri(2-hydroxyethyl) isocyanate tri(meth)acrylate, trimethylolpropyl tri(meth)acrylate, ethyleneoxide (hereinafter abbreviated as EO) modified trimethylolpropyl tri(meth)acrylate, propyleneoxide (hereinafter abbreviated as PO) modified trimethylolpropyl tri(meth) acrylate, tripropylene glycol di(meth)acrylate, neo-pentyl glycol di(meth)acrylate, 1,4-butanediol di(meth)acrylate, 1,6-hexanediol di(meth)acrylate, pentaerythritol tri(meth) acrylate, pentaerythritol tetra(meth)acrylate, polyester di(meth)acrylate, polyethylene glycol di(meth)acrylate, dipentaerythritol hexa(meth)acrylate, dipentaerythritol penta (meth)acrylate, dipentaerythritol tetra(meth)acrylate, caprolactone-modified dipentaerythritol hexa(meth)acrylate, caprolactone-modified dipentaerythritol penta(meth)acrylate, ditrimethylolpropyl tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, PO-modified glycerol triacrylate, EO-modified bisphenol F di(meth)acrylate, phenol novolac polyglycidyl ether(meth)acrylate and the like.

Among the ethylenically unsaturated compounds (B), trimethylolpropyl triacrylate, EO-modified trimethylolpropyl triacrylate, PO-modified trimethylolpropyl triacrylate, pentaerythritol triacrylate, pentaerythritol tetracrylate, dipentaerythritol hexaacrylate, dipentaerythritol pentaacrylate, dipentaerythritol tetraacrylate, caprolactone-modified dipentaerythritol hexaacrylate, ditrimethylolpropyl tetraacrylate, PO-modified glycerol triacrylate and TO-1382 of Toagosei Co., Ltd. are preferred. The above compounds can be used alone or in admixture of two or more.

Photoinitiator (C)

The dosage of the photoinitiator (C) used in the present invention is generally 2~200 parts by weight, preferably 5~180 parts by weight, and more preferably 10~150 parts by weight, based on 100 parts by weight of the photopolymerizable monomer (B).

The photoinitiator (C) comprises an O-acyloxime photoinitiator (C-1) and a triazine photoinitiator (C-2), and the proportion by weight of the photoinitiator (C-1) and the photoinitiator (C-2) is generally 20/80~80/20, preferably 25/75~75/25, and more preferably 30/70~70/30. When the weight of the photoinitiator (C-1) is less than 20% by weight, based on the total weight of the photoinitiator (C-1) and the photoinitiator (C-2), then the shortcoming of poor development property occurs in the development process. When the weight of the photoinitiator (C-1) is more than 80% by weight, then aggregation of pigment occurs, and problems of undercut will be found in the images formed after development.

Based on 100% by weight as the total weight of the photoinitiator (C), then total weight of the photoinitiator (C-1) and the photoinitiator (C-2) is generally between 40~100% by weight, preferably 45~100% by weight, and more preferably 50~100% by weight. When the total weight of the photoinitiator (C-1) and the photoinitiator (C-2) is between 40–100% by weight, then a preferred photosensitive resin composition for color filter is achieved that reduces aggregation of pigment, and the development properties are better, with no undercut in the images formed after development.

The O-acyloxime photoinitiator (C-1) can be exemplified as follows: 1-[4-(phenylthio)phenyl]-heptane-1,2-dione 2-(O-benzoyloxime), 1-[4-(phenylthio)phenyl]-octane-1,2-dione 2-(O-benzoyloxime), 1-[4-(benzoyl)phenyl]-heptane-1,2-dione 2-(O-benzoyloxime), 1-[9-ethyl-6-(2-methylbenzoyl)-9H-carbazole-3-yl]-ethanone 1-(O-acetyloxime), 1-[9-ethyl-6-(3-methyl benzoyl)-9H-carbazole-3-yl]-ethanone 1-(O-acetyloxime), 1-[9-ethyl-6-benzoyl-9H-carbazole-3-yl]-ethanone 1-(O-acetyloxime), ethanone-1-[9-ethyl-6-(2-methyl-4-tetrahydrofuranylbenzoyl)-9H-carbazole-3-yl]-1-(O-acetyloxime), ethanone-1-[9-ethyl-6-(2-methyl-4-tetrahydropyranylbenzoyl)-9H-carbazole-3-yl]-1-(O-acetyloxime), ethanone-1-[9-ethyl-6-(2-methyl-5-tetrahydrofuranylbenzoyl)-9H-carbazole-3-yl]-1-(O-acetyloxime), ethanone-1-[9-ethyl-6-(2-methyl-5-tetrahydropyranylbenzoyl)-9H-carbazole-3-yl]-1-(O-acetyloxime), ethanone-1-[9-ethyl-6-(2-methyl-4-tetrahydrofuranylmethoxybenzoyl)-9H-carbazole-3-yl]-1-(O-acetyloxime), ethanone-1-[9-ethyl-6-(2-methyl-4-tetrahydropyranylmethoxybenzoyl)-9H-carbazole-3-yl]-1-(O-acetyloxime), ethanone-1-[9-ethyl-6-(2-methyl-5-tetrahydrofuranylmethoxybenzoyl)-9H-carbazole-3-yl]-1-(O-acetyloxime), ethanone-1-[9-ethyl-6-(2-methyl-5-tetrahydropyranylmethoxybenzoyl)-9H-carbazole-3-yl]-1-(O-acetyloxime), ethanone-1-[9-ethyl-6-{2-methyl-4-(2,2-dimethyl-1,3-dioxolanyl)benzoyl}-9H-carbazole-3-yl]-1-(O-acetyloxime), ethanone-1-[9-ethyl-6-{2-methyl-4-(2,2-dimethyl-1,3-dioxolanyl)methoxybenzoyl}-9H-carbazole-3-yl]-1-(O-acetyloxime), and the like.

The photoinitiators (C-1) can be used alone or in admixture of two or more according to needs. In the aforementioned O-acyloxime (C-1), 1-2-(O-benzoyloxime), 1-[9-ethyl-6-(2-methylbenzoyl)-9H-carbazole-3-yl]-ethanone 1-(O-acetyloxime), ethanone-1-[9-ethyl-6-(2-methyl-4-tetrahydrofuranylmethoxybenzoyl)-9H-carbazole-3-yl]-1-(O-acetyloxime), and ethanone-1-[9-ethyl-6-{2-methyl-4-(2,2-dimethyl-1,3-dioxolanyl)methoxybenzoyl}-9H-carbazole-3-yl]-1-(O-acetyloxime) are preferred.

The triazine photoinitiator (C-2) of the present invention includes vinyl-halomethyl-s-triazine compounds, 2-(naphth-1-yl)-4,6-bis-halomethyl-s-triazine compounds and 4-(p-aminophenyl)-2,6-di-halomethyl-s-triazine compounds.

The vinyl-halomethyl-s-triazine compounds can be exemplified as follows: 2,4-bis(trichloromethyl)-6-(p-methoxy) styryl-s-triazine, 2,4-bi s(trichloromethyl)-6-(1-p-dimethylaminophenyl-1,3-butadienyl)-s-triazine, and 2-trichloromethyl-4-amino-6-(p-methoxy)styryl-s-triazine.

The 2-(naphth-1-yl)-4,6-bis-halomethyl-s-triazine compounds can be exemplified as follows: 2-(naphtha-1-yl)-4,6-bis-trichloromethyl-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-(4-(2-methoxyethyl-naphtho-1-yl)-4,6-bis-trichloromethyl-s-triazine, 2-(4-(2-ethoxyethyl-naphtho-1-yl)-4,6-bis-trichloromethyl-s-triazine, 2-(4-(2-butoxyethyl-naphtho-1-yl)-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s- triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, and 2-(4,5-dimethoxy-naphtho-1-yl)-4,6-bis-trichloromethyl-s-triazine.

The 4-(p-aminophenyl)-2,6-di-halomethyl-s-triazine compounds can be exemplified as follows: 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-[p-N-chloroethylaminophenyl]-2,6-di(trichloromethyl)-s-triazine, 4-[p-N-ethoxycarbonylmethylaminophenyl]-2,6-di(trichloromethyl)-s-triazine, 4-[p-N,N-di(phenypaminophenyl)-2,6-di(trichloromethyl)-s-triazine, 4-[p-N-chloroethylcarbonylaminophenyl]-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, 4-(o-fluoro-p-N-chloroethylaminophenyl)-2,6-di(trichloromethyl)-s-triazine, and 2,4-bis(trichloromethyl)-6-[3-bromo-4-[N,N-di(ethoxycarbonylmethyl)amino]phenyl]-1,3,5-triazine.

The photoinitiator (C-2) can be used alone or in admixture of two or more according to needs. Preferred examples of the photoinitiator (C-2) include: 4-[m-bromo-p-N,N-di(ethoxycarbonylmethyl)aminophenyl]-2,6-di(trichloromethyl)-s-triazine, and 2,4-Bis(trichloromethyl)-6-(p-methoxy)styryl-s-triazine.

In addition, apart from the photoinitiators (C-1) and (C-2), a photoinitiator (C-3) can further be added to the photosensitive resin composition of the present invention within a range without adversely affecting the original properties, if needed. The photoinitiator (C-3) can be exemplified as follows: acetophenone compounds, biimidazole compounds, benzophenone compounds, α-diketone compounds, acyloin compounds, acyloin ether compounds, acylphosphineoxide compounds, quinone compounds, compounds containing halogens, and peroxides.

Examples of the acetophenone compounds are as follows: p-dimethylamino-acetophenone, α,α'-dimethoxyazoxyacetophenone, 2,2'-dimethyl-2-phenylacetophenone, p-methoxyacetophenone, 2-methyl-1-(4-methylthio phenyl)-2-morpholino propane-1-on, and 2-benzyl-2-N,N-dimethylamino-1-(4-morpholinophenyl)-1-butanone.

Examples of the biimidazole compounds are as follows: 2,2'-bis(o-chlorophenyl)-4,4',5,5'-tetraphenyl-biimidazole, 2,2'-bis(o-fluorophenyl)-4,4',5,5'-tetraphenyl biimidazole, 2,2'-bis(o-methyl phenyl)-4,4',5,5'-tetraphenyl biimidazole, 2,2'-bis(o-methoxyphenyl)-4,4',5,5'-tetraphenyl biimidazole, 2,2'-bis(o-ethylphenyl)-4,4',5,5'-tetraphenyl biimidazole, 2,2'-bis(p-methoxyphenyl)-4,4',5,5'-tetraphenyl biimidazole, 2,2'-bis(2,2',4,4'-tetramethoxyphenyl)-4,4',5,5'-tetraphenyl biimidazole, 2,2'-bis(2-chlorophenyl)-4,4',5,5'-tetraphenyl biimidazole, and 2,2'-bis(2,4-dichlorophenyl)-4,4',5,5'-tetraphenyl biimidazole.

Examples of the benzophenone compounds are as follows: thioxanthone, 2,4-diethylthioxanthanone, thioxanthone-4-sulfone, benzophenone, 4,4'-bis(dimethylamino)benzophenone, and 4,4'-bis(diethylamino)benzophenone.

Examples of the α-diketone compounds include: benzil, and acetyl. Examples of ketone alcohol compounds include: benzoin. Examples of acyloin ether type compounds include: benzoin methylether, benzoin ethylether, and benzoin isopropyl ether. Examples of acyl phosphine oxide compounds include: 2,4,6-trimethyl-benzoyl diphenylphosphineoxide, and bis-(2,6-dimethoxy-benzoyl)-2,4,4-trimethylbenzyl phosphineoxide. Examples of quinone compounds include: anthraquinone, and 1,4-naphthoquinone. Examples of compounds containing halogens include: phenacyl chloride, tribromomethyl phenylsulfone, and tris(trichloromethyl)-s-triazine. Examples of peroxides include: di-tertbutylperoxide.

Among the above photoinitiators (C-3), 2-benzyl-2-N,N-dimethylamino-1-(4-morpholinophenyl)-1-butanone, 2,2'-bis(2,4-dichlorophenyl)-4,4',5,5'-tetraphenyl biimidazole, and 4,4'-bis(diethylamino)benzophenone are preferred. These photoinitiators (C-3) can be used alone or in admixture of two or more.

Organic Solvent (D)

In the photosensitive resin composition for color filter of the present invention, the alkali-soluble resin (A), the photopolymerizable monomer (B), the photoinitiators (C), organic solvent (D) groups and the under-mentioned pigment (E) are essential components. Moreover, the composition may optionally contain other additives as required.

All the above components except the pigment (E) are generally dissolved in an appropriate organic solvent (D) to prepare a liquid composition, and then the pigment (E) is mixed therein. Any solvents, which are inert to the other components, having appropriate volatility can be selectively used as long as they can disperse or dissolve one of the following components, that is, the alkali-soluble resin (A), the photopolymerizable monomer (B), the photoinitiators (C), the pigment (E) and the additives.

The dosage of the organic solvent (D) used in the present invention is generally 500-5,000 parts by weight, preferably 800~4,500 parts by weight, and more preferably 1,000~4,000 parts by weight, based on 100 parts by weight of the alkali-soluble resin (A).

Examples of the above organic solvents (D) can be the same as described for the aforementioned solvents used for polymerization of the alkali-soluble resin (A). Among these solvents, the propylene glycol monomethyl ether acetate and ethyl 3-ethoxypropionate are preferred. These organic solvents (D) can be used alone or in admixture of two or more.

Pigment (E)

The dosage of the pigment (E) used for preparing the photosensitive resin composition for color filter in the present invention is generally 100~800 parts by weight, preferably 150~600 parts by weight, more preferably 200~500 parts by weight, based on 100 parts by weight of the alkali-soluble resin (A).

The pigment (E) comprises a halogenated phthalocyanine compound (E-1) represented by the following Formula (1).

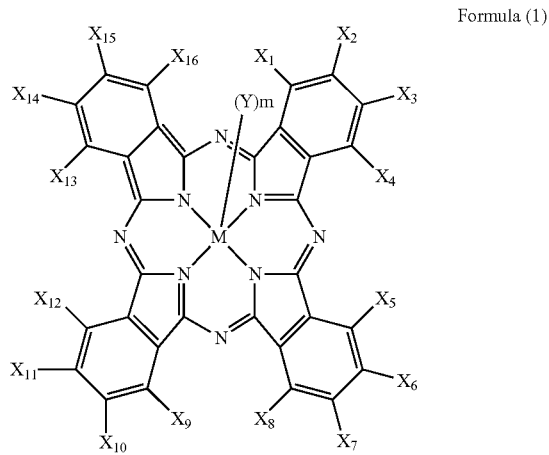

Formula (1)

wherein, M is Al, Si, Sc, Ti, V, Fe, Co, Ni, Zn, Ga, Ge, Y, Zr, Nb, Sn or Pb; $X_1$~$X_{16}$ are hydrogen atoms or halogen atoms, and the halogen atoms are fluorine atoms, chlorine atoms, bromine atoms or iodine atoms. The total number of halogen atoms is an integer between 8~16; Y are fluorine atoms, chlorine atoms, bromine atoms, iodine atoms, oxygen atoms or hydroxyl groups; and m is an integer between 0~2.

Based on 100 parts by weight of the alkali-soluble resin (A), the dosage of the halogenated phthalocyanine compound (E-1) is generally 50-500 parts by weight, preferably 75~450 parts by weight, and more preferably 100~400 parts by weight.

The halogenated phthalocyanine compound represented by the Formula (1) is a halogenated phthalocyanine compound using Al, Si, Sc, Ti, V, Fe, Co, Ni, Zn, Ga, Ge, Y, Zr, Nb, Sn or Pb as the central metallic atom. Taking into consideration color purity, color density, transparency of the coating film formed by the photosensitive resin composition, as well as thermal stability, a halogenated phthalocyanine compound with Al, Fe, Ni, Ga or Zn as the central metal is preferred as the halogenated phthalocyanine compound (E-1).

Regarding the aforementioned Formula (1), when the central atom M is a bivalent metal, and m is 0, then there is no ligand Y. When the central atom M is a trivalent metal, then there exists a monovalent ligand Y. When the central atom M is quadrivalent metal, then there exists a bivalent ligand Y or two monovalent ligand Y.

The aforementioned ligand Y can be exemplified as follows: fluorine atoms, chlorine atoms, bromine atoms, iodine atoms, oxygen atoms or hydroxyl groups. When the ligand Y of the halogenated phthalocyanine compound (E-1) represented by the Formula (1) is a hydroxyl group, then, after the halogenated phthalocyanine compound with a hydroxyl group ligand Y has undergone a dehydration reaction, a dimer or oligomer is formed. If $X_nPcMY_m$ is used to represent the halogenated phthalocyanine compound (E-1) depicted in the Formula (1) used in the present invention, and when M is a metal having a valence of three, then dimers depicted by $X_nPcMOPcX_n$ are formed after carrying out the under-mentioned reaction Equation (1):

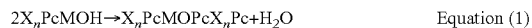

$2X_nPcMOH \rightarrow X_nPcMOPcX_nPc + H_2O$   Equation (1)

when M is a metal having a valence of more than four, then oligomers represented by $HOX_nPcMO(X_nPcMO)_{z-2}X_nPcMOH$ are formed after carrying out the under-mentioned reaction Equation (2):

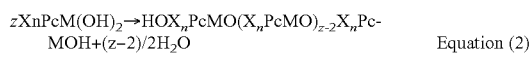

$zXnPcM(OH)_2 \rightarrow HOX_nPcMO(X_nPcMO)_{z-2}X_nPc\text{-}MOH+(z-2)/2H_2O$   Equation (2)

when M is a metal having a valence of more than four and the ligand Y is a hydroxyl group, then complexes with oxo bridges (μ-oxo) are easily formed after carrying out the under-mentioned reaction Equation (3):

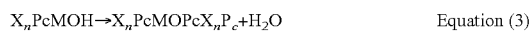

$X_nPcMOH \rightarrow X_nPcMOPcX_nP_c + H_2O$   Equation (3)

In the halogenated phthalocyanine compound (E-1) represented by the aforementioned Formula (1), the halogen atoms on the aromatic ring are 8~16 fluorine, chlorine, bromine or iodine atoms, and the halogen atoms can be all identical or different. When the halogen atoms on the aromatic ring are at least 8 bromine atoms, then it is preferred that the halogenated phthalocyanine compound (E-1) must further comprise at least 1 chlorine atom. When the halogen atoms on the aromatic ring are at least 12 bromine atoms, then the halogenated phthalocyanine compound (E-1) must further comprise at least 2 chlorine atoms, and is better suited for use in green pixels for high transparency color filter.

Compared to halogenated phthalocyanine compounds with central metal containing copper used as a color pigment in the photosensitive resin composition of the prior art, then half-amplitude of spectrophotometric transmittance of the halogenated phthalocyanine compound (E-1) represented by the Formula (1) is relatively small, and maximum transmittance value is relatively high. This is because the halogenated phthalocyanine compound represented by the Formula (1) has relatively high color purity and color density compared to halogenated phthalocyanine compounds with central metal containing copper used in the prior art technology, and provides better transparency. Hence, using green pixels formed from the halogenated phthalocyanine compound (E-1) represented by the Formula (1) in a color filter provides superior contrast and high brightness.

The halogenated phthalocyanine compound (E-1) represented by the Formula (1) can use the methods used to manufacture halogenated phthalocyanine compounds containing metal of the prior art, such as: the manufacturing methods including the chlorosulfonic acid method, and the halogenated phthalonitrile method disclosed in Japanese Patent Publication No. 50-130,816.

In the photosensitive resin composition for color filter of the present invention, apart from using the halogenated phthalocyanine compound (E-1) represented by the Formula (1), under the condition that it does not affect properties of the color filter, other green pigment (E-2) can also be used for the pigment (E). Examples of the green pigment (E-2) include: C.I. pigment green 07, C.I. pigment green 36, and C.I. pigment green 37.

In the photosensitive resin composition for color filter of the present invention, in the constituents of the pigment (E), under conditions in which the halogenated phthalocyanine compound (E-1) exists, then yellow pigment (E-3) can also be mixed therewith. In which, green pigment and the yellow pigment (E-3) contained within the halogenated phthalocyanine compound (E-1) can be proportionally adjusted according to color requirements.

Examples of the yellow pigment (E-3) used by the present invention include: yellow organic pigments: C.I. pigment yellow 12, 13, 14, 17, 20, 24, 31, 55, 83, 93, 109, 110, 128, 138, 139, 150, 153, 154, 155, 166, 168, 180, 185, 211, and 219. The aforementioned yellow organic pigments may be used alone or in admixture of two or more. Taking into consideration color purity and transparency, C.I. pigment yellow 83, 138, 139. 150, 185, 219 are preferred.

In the photosensitive resin composition for color filter of the present invention, the average particle diameter of primary particles of the pigment (E) is generally 10~200 nm, preferably 20~150 nm, and more preferably 30~100 nm.

In the present invention, the average primary particle diameter of the pigment (E) can be micronized using methods including mechanically grinding the pigment (abbreviated as grinding method); dissolving the pigment in a dissolvable solvent followed by an undissolvable solvent to precipitate the finer pigment (abbreviated as precipitation method); producing finer pigment particles during synthesis (abbreviated as synthesis precipitation), and the like.

The pigment (E) in the present invention can be used in combination with a dispersant as desired. The dispersant is, for example, a cationic, anionic, nonionic or amphoteric surfactant, or a silicone-based or fluorine-based surfactant in terms of composition.

In which, the surfactants can be exemplified as follows: polyoxyethylene alkyl ethers such as polyoxyethylene lauryl ether, polyoxyethylene stearyl ether, and polyoxyethylene oleyl ether; polyoxyethylene alkylphenyl ethers such as polyoxyethylene octylphenyl ether, and polyoxyethylene nonyl benzyl ether and the like; polyethylene glycol diesters such as polyethylene glycol dilaurate, and polyethylene glycol distearate; sorbitan fatty acid esters and the like; polyesters such as modified aliphatic acids; polyurethanes such as modified triethylamine. The following are trade names: KP (ShinEtsu Chemical Industry), SF-8427 (manufactured by Toray Dow Corning Silicon), Polyflow (manufactured by Kyoeisha Oil Chemical Industry), F-Top (manufactured by Tochem Products Co., Ltd.), Megafac (manufactured by Dai-Nippon Ink Chemical Industry), Fluorade (manufactured by Sumitomo 3M), Asahi Guard, Surflon (manufactured by Asahi Glass), and so on. The above surfactants can be used alone or in admixture of two or more.

To improve coatability of the present invention, the photosensitive resin composition can be used in combination with surfactants. The dosage of the surfactants used in the present invention is generally 0~6 parts by weight, preferably 0~4 parts by weight, and more preferably 0~3 parts by weight, based on 100 parts by weight of said alkali-soluble resin (A). Examples of the surfactants are the same as the surfactants used in the aforementioned pigment.

The photosensitive resin composition in the present invention can contain other additives, such as fillers, polymers other than the alkali-soluble resin (A) according to the present invention, adhesion agents, antioxidants, UV absorbents, anti-coagulants, and the like. The dosage of the additives used in the present invention is generally 0~10 parts by weight, preferably 0~6 parts by weight, more preferably 0~3 parts by weight, based on 100 parts by weight of the alkali-soluble resin (A).

Examples of the additives can be exemplified as follows: glass, aluminum fillers; high-molecular compounds excluding the alkali-soluble resin (A) such as polyvinyl alcohol, polyglycol monoether, and polyacrylate fluoride; adhesion accelerating agents such as vinyl trimethoxysilane, vinyl tri (2-methoxyethoxy)silane, N-(2-aminoethyl)-3-aminopropylmethyl dimethoxysilane, N-(2-aminoethyl)-3-aminopropyl trimethoxysilane, 3-aminopropyl triethoxysilane, 3-epoxypropyl trimethoxysilane, 3-epoxypropylmethyl dimethoxysilane, 2-(3,4-epoxycyclohexyl) ethyltrimethoxysilane, 3-chloropropyl methyldimethoxysilane, 3-chloropropyl trimethoxysilane, 3-methylpropenyloxypropyl trimethoxysilane, 3-thiolpropyl trimethoxysilane; antioxidants such as 2,2-thiobis(4-methyl-6-tert-butylphenol), 2,6-di-tert-butylphenol; ultraviolet ray absorbents such as 2-(3-tert-butyl-5-methyl-2-hydroxy phenyl)-5-chlorobenzothiazole, alkoxy benzophenone; and antiagglutinants such as sodium polyacrylate.

The rate of change of viscosity of the photosensitive resin composition of the present invention stored at a temperature of 45° C. for 7 days, when compared to its initial viscosity, is generally below 10%, preferably below 9%, and more preferably below 8%. When the rate of change of viscosity is below 10%, then thickness uniformity of the coating film is superior.

Another objective of the present invention lies in providing a color filter, in which the color filter comprises pixels, and the pixels are formed using the aforementioned photosensitive resin composition for color filter.

The color filter of the present invention can be manufactured by the method as described below.

The above-mentioned photosensitive resin composition for color filter is coated on a substrate and then dried at low pressure to remove most of the solvent. A coating film is formed after completely evaporating the residual solvent by pre-bake. Examples of coating processes include spin coating, slit coating and roll coating. Operation conditions for low-pressure drying and pre-bake are dependent on the kinds and dosages of the components used in the photosensitive resin composition. In general, low-pressure drying is carried out at 0~200 mm-Hg for 1~60 seconds, and pre-bake is carried out at 70° C.~110° C. for 1~15 minutes.

Then, the coating film is exposed to UV light through a specific photo mask, and developed in a developer solution at 23±2° C. for 15 seconds to 5 minutes to dissolve and remove the unexposed portions of the coating film so as to give a desired pattern. The UV light used for this purpose can be g line, h line, i line, and the like. The UV lamp is a (ultra) high-pressure mercury lamp or a metal halide lamp.

The substrate used to form the color filter is made from bare glass, soda glass, pyres glass, or silica glass, and the glass was coated with a transparent conductive film, or a transparent electrode substrate was used in a solid state image pick up device. A black matrix is formed on the substrate to separate each color pixel element.

The alkali developer is preferably an aqueous solution of sodium hydroxide, potassium hydroxide, sodium carbonate, sodium hydrogencarbonate, potassium carbonate, potassium hydrogencarbonate, sodium silicate, sodium methylsilicate, aqueous ammonia, ethylamine, diethylamine, dimethyl ethanolamine, tetramethylammonium hydroxide, tetraethylammonium hydroxide, choline, pyrrole, piperidine, 1,8-diazabicyclo(5,4,0)-7-undecene, and the like. The concentration of alkali developer is 0.001 wt %~10 wt %, preferably 0.005 wt %~5 wt %, and more preferably 0.01 wt %~1 wt %.

After developing with the developer solution, the resulting pattern is sufficiently washed with water and dried with compressed air or compressed nitrogen.

Finally, it is baked with a heating device such as a hot plate or an oven at 100° C.~280° C. for 1~15 minutes to remove the volatile components of the coating film, and to undergo a thermal reaction with the unreacted ethylenically unsaturated double bonds in the coating film.

By repeating the above procedures for photosensitive resin composition comprising red, green and blue pigment dispersed therein, a color filter having arrays of red, green and blue pixels arranged on the substrate is obtained.

Moreover, the ITO electrode film can be formed on the color pixels using a sputtering procedure at 220° C.~250° C., which can be etched and patterned according to needs. Then, a polyimide polymer is coated on the ITO electrode film to form an alignment layer, and the color filter for LCD is obtained.

Yet another objective of the present invention lies in providing a liquid display element, in which the liquid display element comprises the aforementioned color filter.

The liquid display element of the present invention can be manufactured by the method as described below.

Two substrates each having the liquid crystal alignment film formed according to the aforementioned manufacturing method of the liquid crystal alignment film are prepared and oppositely disposed to each other with a space (cell gap). The peripheral portions of the two substrates are joined together with a sealing agent, liquid crystals are filled into the cell gap defined by the surfaces of the substrates and the sealing agent, and an injection hole is sealed up to form a liquid crystal cell. Then, a polarizer is affixed to the exterior sides of the substrates forming the crystal cell to obtain the liquid crystal display element.

The sealing agent can be used an epoxy resin containing a curing agent, and spacer material can be used glass beads, plastic beads, or photosensitive epoxy resin. Examples of liquid crystals include nematic liquid crystals, such as Schiff base liquid crystals, azoxy liquid crystals, biphenyl liquid crystals, phenylcyclohexane liquid crystals, ester liquid crystals, terphenyl liquid crystals, biphenylcyclohexane liquid crystals, pyrimidine liquid crystals, dioxane liquid crystals, bicyclooctane liquid crystals, cubane liquid crystals, and the like. To the above liquid crystals may be added cholesteric liquid crystals, such as cholesteryl chloride, cholesteryl nonanoate, cholesteryl carbonate, a chiral agent marketed under the trade names of C-15 or CB-15 (products of Merck Company), and the like. In addition, the polarizer affixed to the exterior sides of the liquid crystal cell may be used, for example, a polarizer comprising cellulose acetate protective films sandwiching the polarizing film called "H film" which has absorbed iodine while a polyvinyl alcohol is stretched and aligned, or a polarizer composed of the H film itself.

To enable a further understanding of said objectives and the technological methods of the invention herein, a brief description of the drawings is provided below followed by a detailed description of the preferred embodiments. The present invention will be further illustrated by the following examples.

BRIEF DESCRIPTION OF ATTACHED TABLES

Table 1 depicts the proportions of each example of synthesis of alkali-soluble resin (A) of the present invention, and Table 2 depicts composition ratios and evaluation results of embodiments and comparative examples of the photosensitive resin composition of the present invention.

DETAILED DESCRIPTION OF THE PREFERRED EMBODIMENTS OF THE PRESENT INVENTION

Synthesis of Alkali-soluble Resin (A)

Synthesis Example A-1

Figure 1:
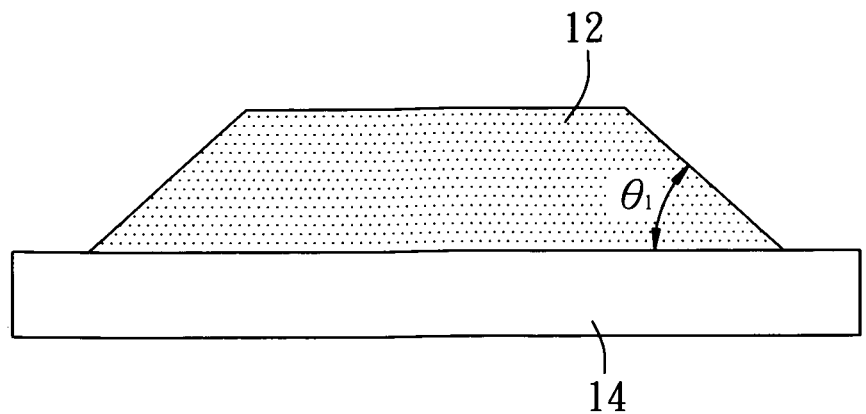
FIG. 1 shows a first edge profile state of a photosensitive resin layer.

A 1000 ml four-necked conical flask equipped with a stirrer, a heater, a condenser, and a thermometer was purged with nitrogen. Then a mixture of monomers including: 40 parts by weight of 2-methacryloyloxyethyl succinate monoester (hereafter abbreviated as HOMS), 10 parts by weight of methyl acrylate monomer (hereafter abbreviated as MA), 15 parts by weight of styrene monomer (hereafter abbreviated as SM), 30 parts by weight of the benzyl methacrylate monomer (hereafter abbreviated as BzMA), 5 parts by weight of 2-hydroxyethyl methacrylate (hereafter abbreviated as HEMA), and 200 parts by weight of solvent ethyl 3-ethoxypropionate (hereafter abbreviated as EEP), as shown in Table 1, was charged to the flask. The monomer mixture was charged in one shot. The mixture in the conical flask was stirred and the temperature of the oil bath was raised to 100° C.

Then 6 parts by weight of the initiator 2,2'-azobis-2-methyl butyronitrile (hereafter abbreviated as AMBN) was dissolved in the organic solvent EEP, as shown in Table 1, the initiator solution was divided into 5 divisions and charged into the four-necked conical flask.

Reaction temperature during the polymerization process was maintained at 100° C., and polymerization time was 6 hours. After polymerization, the polymer solution was poured out and the solvent was devolatilized to give the alkali-soluble resin (A-1).

Synthesis Examples A-2 and A-3

The procedure of Synthesis Example A-1 was repeated, except that the kinds and dosages of the monomers were changed. The formulation, reaction conditions and molecular weight distribution were shown in Table 1.

Synthesis of Pigment (E)

Synthesis Example of Halogenated Phthalocyanine Compound (E-1)

A 1000 ml four-necked conical flask equipped with a stirrer, a heater, a condenser, and a thermometer was purged with nitrogen, and then 25.0 g of 4,5-dichlorophthalic acid anhydride, 24.2 g of urea, 0.14 g of ammonium molybdate tetrahydrate and 50 ml of methylnaphthalene were added, after which 50 ml of methylnaphthalene solution containing 5.17 g of gallium trichloride was added, and was allowed to react for 5 hours under a nitrogen environment at a temperature of 190~200° C. After the reaction, the reaction solution was filtered to obtain the precipitate, and the precipitate was sequentially cleaned using methanol, NMP (N-methyl-2-pyrrolidone). After drying, the halogenated phthalocyanine compound (E-1-1) depicted by Formula (2) was obtained:

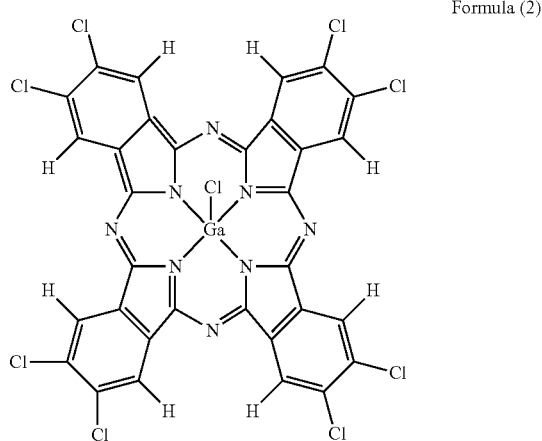

Formula (2)

Examples and Comparative Examples of the Photosensitive Resin Composition

Example 1

100 parts by weight (based on dry matter) of the alkali-soluble resin (A-1) obtained in the above Synthesis Example A-1, 100 parts by weight of dipentaerythritol hexaacrylate (DPHA, manufactured by Toagosei Ltd., hereafter abbreviated as B-1), 12 parts by weight of 1-[9-ethyl-6-(2-methylbenzoyl)-9H-carbazole-3-yl]-ethanone 1-(O-acetyl oxime) (hereafter abbreviated as C-1-1), 48 parts by weight of 4-[m-bromo-p-N,N-di(ethoxycarbonylmethyl)animophenyl]-2,6-di(trichloromethyl)-s-triazine, 15 parts by weight of 2,2'-bis(2,4-dichlorophenyl)-4,4',5,5'-tetraphenyl biimidazole (hereafter abbreviated as C-3-1), 125 parts by weight of green pigment halogenated phthalocyanine compound with Ga as central atom (hereafter abbreviated as E-1-1) and 125 parts by weight of yellow pigment C.I. pigment yellow 138 (hereafter abbreviated as E-3-1) were added to 1,900 parts by weight of solvent ethyl-3-ethoxy propionate (hereafter abbreviated as D-1) and 875 parts by weight of propylene glycol methyl ether acetate (hereafter abbreviated as D-2), whereupon the mixture was dissolved and mixed using a shaking mixer, thereby blending and obtaining the photosensitive resin composition for color filter. The photosensitive resin composition was evaluated using the Evaluation Method described below, results of which were shown in Table 2.

Evaluation Method (1). Rate of Change of Viscosity

Viscosity of the photosensitive resin composition was measured using an E model viscosimeter (manufactured by Toki Sangyo Co., Ltd. (ELD model viscosimeter (RE-80L)), under conditions of a temperature of 25° C., and a rotational velocity of 20 rpm, and separate measurements were taken of the viscosity of the manufactured photosensitive resin composition, this being viscosity (a), and viscosity of the photosensitive resin composition stored for 7 days at a temperature of 45° C., this being viscosity (b). The rate of change of viscosity of the viscosity values obtained were calculated using the following equation:

$$[\text{rate of change of viscosity}] = [\text{viscosity}(a) - \text{viscosity}(b)]/[\text{viscosity}(a)] \times 100\%$$

(2) Aggregation of Pigment

The photosensitive resin composition was coated on a 100 mm×100 mm glass substrate using a rotation coating method, and decompression drying was first carried out at a pressure of 100 mmHg for 30 seconds, after which pre-bake was implemented at a temperature of 80° C. for 3 minutes, thereby forming a pre-baked coating film of 2.5 μm film thickness. The pre-baked coating film was irradiated with ultraviolet rays (light exposure machine Canon PLA-501F) at a light quantity of 300 mJ/cm$^2$, after which it was immersed in a developing solution at a temperature of 23° C. for 2 minutes, cleaned with pure water, and then post-baked at 200° C. for 80 minutes, thereby forming a resin layer of photosensitive resin of 2.0 μm film thickness on the glass substrate.

The photosensitive resin layer obtained was observed whether or not pigment aggregated particles had appeared using an optical microscope (pigment aggregated particles were generally between 1~10 μm in size), and was evaluated using the following criteria.

Figure 2:
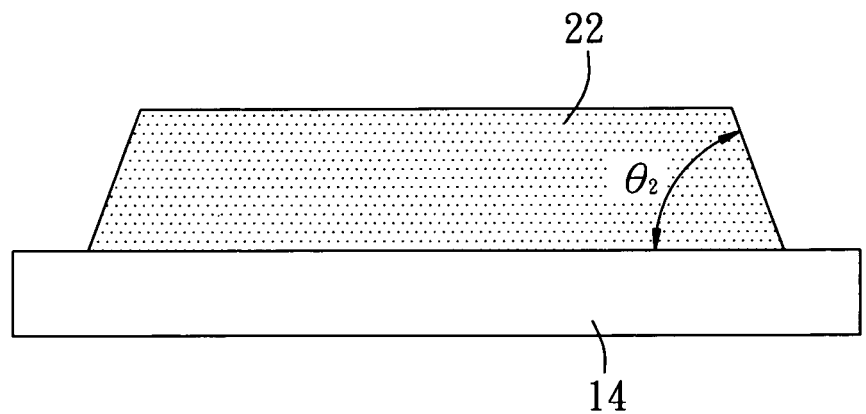
FIG. 2 shows a second edge profile state of a photosensitive resin layer.
Figure 3:
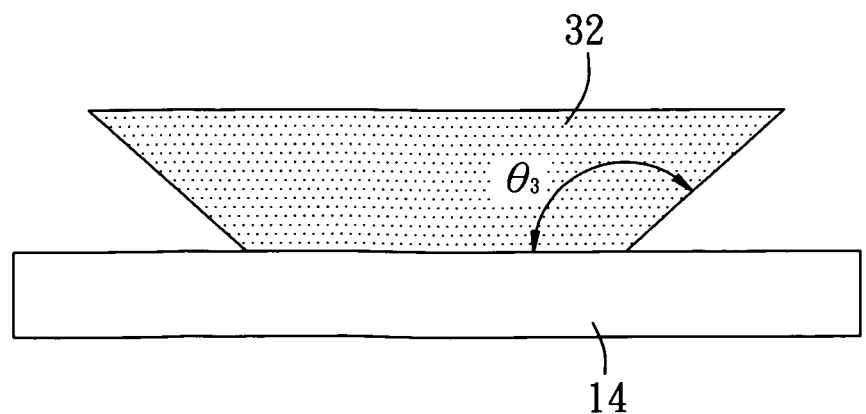
FIG. 3 shows a third edge profile state of a photosensitive resin layer.

○: No aggregation of pigment
Δ: Little aggregation
X: Substantial aggregation of pigment (3) Undercut The photosensitive resin layer obtained from evaluation method (2) was observed using a scanning electron microscope (SEM), and undercut was evaluated based on the shape of the edge profile:

○: Referring to FIG. 1, the edge angle (opposite to the sidewall angle of substrate (14)) of a photosensitive resin layer (12) was $10° < \theta_1 \leq 60°$.
Δ: Referring to FIG. 2, the edge angle (opposite to the sidewall angle of the substrate (14)) of the photosensitive resin layer (22) was $60° < \theta_2 \leq 90°$.
X: Referring to FIG. 3, the edge angle (opposite to the sidewall angle of substrate (14)) of the photosensitive resin layer (32) was $\theta_3 > 90°$.

(4) Development Properties

The examples and the comparative examples of the photosensitive resin composition were coated on a 100 mm×100 mm glass substrate using a rotation coating method, and decompression drying was first carried out at a pressure of 100 mmHg for 30 seconds, after which pre-bake was implemented at a temperature of 80° C. for 3 minutes, thereby forming a pre-baked coating film of 1.0 μm film thickness.

The aforementioned coating film was titrated using 2 ml of 2% by weight of potassium hydroxide water solution, and the time required to dissolve the coating film was measured, development properties were evaluated based on the required time, the evaluation criteria being as follows:
⊚: Development time≦5 seconds
○: 5 seconds<development time≦5 seconds
Δ: 10 seconds<development time≦5 seconds
X: Development time>15 seconds
(5) Contrast Contrast of the photosensitive resin layer obtained from the evaluation method (2) was calculated using the brightness measured by the methods depicted in FIG. 4 and FIG. 5. In which, the photosensitive resin layer (1) obtained was placed between two polarizing filters (2), (3), and the light emanating from a light source (4) was made to sequentially penetrate the polarizing filter (2), the photosensitive resin layer (1), and the polarizing filter (3), the brightness (cd/cm$^2$) finally penetrating the polarizing filter (3) was then measured using a brightness meter (5) (manufactured by Japan Topcon Company, model No. BM-5A).

Figure 4:
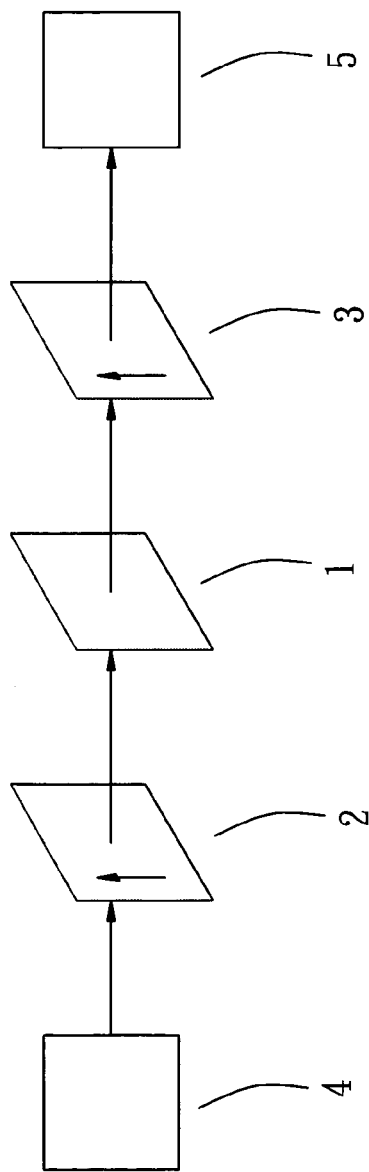
FIG. 4 is a schematic view depicting a contrast measurement state (1) of the photosensitive resin layer.
Figure 5:
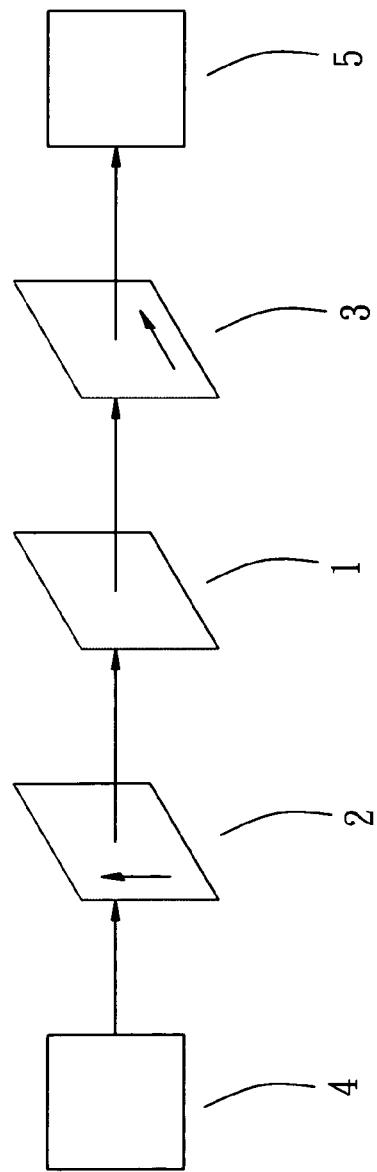
FIG. 5 is a schematic view depicting a contrast measurement state (2) of the photosensitive resin layer.
Figure 6:
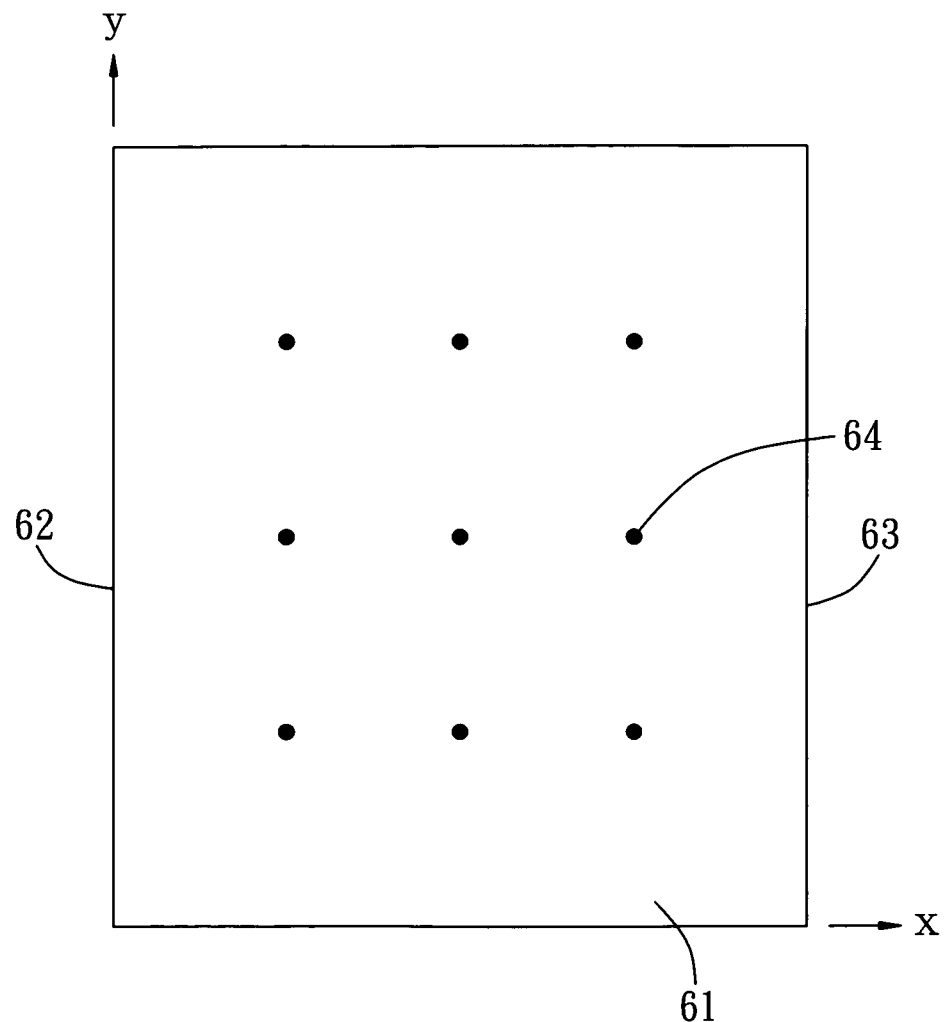
FIG. 6 is a schematic view depicting distribution of film thickness measurement points of the photosensitive resin layer.

Referring to FIG. 4, when the polarization direction of the polarizing filter (3) and the polarization direction of the polarizing filter (2) were mutually parallel, then the measured brightness was A (cd/cm$^2$). In addition, referring to FIG. 5 again, when the polarization direction of the polarizing filter (3) and the polarization direction of the polarizing filter (2) were mutually perpendicular, then the measured brightness was B (cd/cm$^2$). Accordingly, the contrast was obtained using the ratio of brightness A and the brightness B (brightness A/brightness B), the evaluation criteria being as follows:
○: 1500≦(brightness A/brightness B)
Δ: 900≦(brightness A/brightness B)<1500
X: (brightness A/brightness B)<900
(6) Brightness The photosensitive resin layer obtained by evaluation method (2), under the conditions of a CIE standard illuminant C, and based on a 2 degree field of view, a colorimeter (manufactured by Otsuka Electronics Company, model No. MCPD) was used to measure the chromaticity coordinate values (x, y) and brightness Y values of the CIE (International Commission on Illumination) color specification system for the obtained photosensitive resin layer; a larger Y value representing a higher brightness.
○: 50≦Y value
Δ: 35≦Y value<50
X: Y value<35
(7) Film Thickness Uniformity The photosensitive resin composition was coated on a 960 mm×1100 mm rectangular glass substrate using a slit coating method, and was then pre-baked at a temperature of 110° C. for 90 seconds, thereby forming a pre-baked coating film. A Tencor α-step contact (stylus) measuring instrument was then used to measure the film thickness. FIG. 6 depicts the distribution state of the film thickness measurement points. In which, length along the x axis direction of a glass substrate (61) was 960 nm, and length along the y axis direction was 1100 nm. The end of the substrate (61) where a x=0 was a starting end (62), and another end opposite to the starting end (62) of the substrate (61) was a terminal end (63). Slit coating direction of the photosensitive resin composition was from the starting end (62) parallel to the x axis towards the terminal end (63).

The (x,y) coordinates of FT(avg) were: (240,275), (480, 275), (720,275), (240,550), (480,550), (720,550), (240,825), (480,825), and (720,825), obtaining altogether 9 average values at the measurement points (64) for the film thickness.
FT(x,y)$_{max}$: maximum value film thickness obtained for the aforementioned 9 measurement points (64).
FT(x,y)$_{min}$: minimum value film thickness obtained for the aforementioned 9 measurement points (64).

The film thickness uniformity was determined using the following formula:

$$\text{Film thickness uniformity} = \frac{FT(x, y)_{max} - FT(x, y)_{min}}{2 \times FT(avg)} \times 100\%$$

○: Film thickness uniformity≦3%
Δ: 3%<Film thickness uniformity≦5%
X: 5%<Film thickness uniformity Example 2

The procedure of Example 1 was repeated, except that the kind of the alkali-soluble resin (A), the kind of the photopolymerizable monomer (B), the kind of the photoinitiator (C), the dosage of the solvent (D) used and the kind of the pigment (E) were changed. The formulation and evaluation results were shown in Table 2.

Example 3

The procedure of Example 1 was repeated, except that the kind of the alkali-soluble resin (A), the kind of the photoinitiator (C), the dosage of the solvent (D) used and the kind of the pigment (E) were changed. The formulation and evaluation results were shown in Table 2.

Example 4

The procedure of Example 1 was repeated, except that the kind of the alkali-soluble resin (A), the dosage of the photopolymerizable monomer (B), the dosage of the photoinitiator (C), the dosage of the solvent (D) used and the kind of the pigment (E) were changed. The formulation and evaluation results were shown in Table 2.

Example 5

The procedure of Example 1 was repeated, except that the kind of the alkali-soluble resin (A), the kind of the photopolymerizable monomer (B), the kind of the photoinitiator (C), the dosage of the solvent (D) used and the kind of the pigment (E) were changed. The formulation and evaluation results were shown in Table 2.

Example 6

The procedure of Example 1 was repeated, except that the kind of the alkali-soluble resin (A), the dosage of the photopolymerizable monomer (B), the kind of the photoinitiator (C), the dosage of the solvent (D) used and the kind of the pigment (E) were changed. The formulation and evaluation results were shown in Table 2.

Example 7

The procedure of Example 1 was repeated, except that the kind of the photopolymerizable monomer (B), the kind of the photoinitiator (C), the dosage of the solvent (D) used and the kind of the pigment (E) were changed. The formulation and evaluation results were shown in Table 2.

Example 8

The procedure of Example 1 was repeated, except that the kind of the alkali-soluble resin (A), the kind of the photoinitiator (C) and the kind of the pigment (E) were changed. The formulation and evaluation results were shown in Table 2.

Example 9

The procedure of Example 1 was repeated, except that the kind of the alkali-soluble resin (A), the kind of the photoinitiator (C), the dosage of the solvent (D) used and the kind of the pigment (E) were changed. The formulation and evaluation results were shown in Table 2.

According to the aforementioned, the examples 1~9 were all able to achieve the anticipated objectives of satisfactorily reducing aggregation of pigment, providing superior development properties, and forming images having no undercut after development, In which, examples 1~6 and example 8 were the preferred examples.

Comparative Example 1

The procedure of Example 1 was repeated, except that the kind of the dosage of the photoinitiator (C), the dosage of the solvent (D) used and the kind of the pigment (E) were changed. The formulation and evaluation results were shown in Table 2.

Comparative Example 2

The procedure of Example 1 was repeated, except that the kind of the alkali-soluble resin (A), the kind of the photopolymerizable monomer (B), the dosage of the photoinitiator (C), the dosage of the solvent (D) used and the kind of the pigment (E) were changed. The formulation and evaluation results were shown in Table 2.

Comparative Example 3

The procedure of Example 1 was repeated, except that the kind of the alkali-soluble resin (A), the kind of the photoinitiator (C), the dosage of the solvent (D) used and the kind of the pigment (E) were changed. The formulation and evaluation results were shown in Table 2.

Comparative Example 4

The procedure of Example 1 was repeated, except that the dosage of the alkali-soluble resin (A), the dosage of the photopolymerizable monomer (B), the kind of the photoinitiator (C), the dosage of the solvent (D) used and the kind of the pigment (E) were changed. The formulation and evaluation results were shown in Table 2.

Comparative Example 5

The procedure of Example 1 was repeated, except that the kind of the alkali-soluble resin (A), the dosage of the photopolymerizable monomer (B), the kind of the photoinitiator (C), the dosage of the solvent (D) used and the kind of the pigment (E) were changed. The formulation and evaluation results were shown in Table 2.

Comparative Example 6

The procedure of Example 1 was repeated, except that the kind of the alkali-soluble resin (A), the dosage of the photopolymerizable monomer (B), the kind of the photoinitiator (C), the dosage of the solvent (D) used and the kind of the pigment (E) were changed. The formulation and evaluation results were shown in Table 2.

Comparative Example 7

The procedure of Example 1 was repeated, except that the kind of the alkali-soluble resin (A), the dosage of the photopolymerizable monomer (B), the kind of the photoinitiator (C), the dosage of the solvent (D) used and the kind of the pigment (E) were changed. The formulation and evaluation results were shown in Table 2.

Comparative Example 8

The procedure of Example 1 was repeated, except that the kind of the alkali-soluble resin (A), the dosage of the photopolymerizable monomer (B), the kind of the photoinitiator (C), the dosage of the solvent (D) used and the kind of the pigment (E) were changed. The formulation and evaluation results were shown in Table 2.

While the present invention is illustrated with the preferred embodiments aforementioned, scope of the invention is not thus limited and should be determined in accordance with the appended claims.

TABLE 1

Constituent Proportions of Examples of Synthesis of Alkali Soluble Resin (A)

| Example of Synthesis | Copolymerization Monomer (a-1) | | | Copolymerization Monomer (a-2) | | | | Initiating Agent | Solvent | Monomer Feeding Method | Reaction Temp. (°C.) | Polymerization Time (hours) |
|---|---|---|---|---|---|---|---|---|---|---|---|---|
| | HOMS | MAA | MA | SM | FA-512A | BzMA | HEMA | AMBN | EEP | | | |
| A-1 | 40 | | 10 | 15 | | 30 | 5 | 6 | 200 | continuously added | 100 | 6 |
| A-2 | 25 | 20 | | | 10 | 35 | 10 | 6 | 200 | continuously added | 100 | 6 |
| A-3 | | 30 | 10 | 20 | 10 | 30 | | 6 | 200 | continuously added | 100 | 6 |

Abbreviat English name
HOMS 2-methacryloyloxyethyl succinate monoester
MAA methacrylic acid
MA methyl acrylate
SM styrene monomer
FA-512A dicyclopentenyloxyethyl acrylate
BzMA benzyl methacrylate
HEMA 2-hydroxyethyl methacrylate
AMBN 2,2'-azobis-2-methyl butyronitrile
EEP ethyl 3-ethoxypropionate

TABLE 2

Constituent Proportions and Evaluation Results of Examples and
Comparative Examples of the Photosensitive Resin Composition

| Constituents | | Examples | | | | | | | | |
|---|---|---|---|---|---|---|---|---|---|---|
| | | 1 | 2 | 3 | 4 | 5 | 6 | 7 | 8 | 9 |
| Alkali Soluble Resin (A) | A-1 | 100 | | | 50 | 50 | | 100 | | 50 |
| (parts by weight) | A-2 | | 100 | | 50 | | 80 | | 100 | 50 |
| | A-3 | | | 100 | | 50 | 20 | | | |
| Compound Containing | B-1 | 100 | 50 | 100 | 90 | 60 | 90 | 50 | 100 | 100 |
| Ethylenically Unsaturated | B-2 | | 30 | | | 20 | | 30 | | |
| Groups (B) (parts by weight) | | | | | | | | | | |
| Photo-Initiating Agent (C) | C-1-1 | 12 | 15 | | | 26 | 30 | 48 | | |
| (parts by weight) | C-1-2 | | | 24 | 30 | 10 | 5 | | 12 | 14 |
| | C-2-1 | 48 | | 36 | | 24 | | 6 | 30 | |
| | C-2-2 | | 35 | | 30 | | 15 | 6 | 18 | 14 |
| | C-3-1 | 15 | | | 15 | | 30 | | 15 | 47 |
| | C-3-2 | | 10 | | | 10 | | | | |
| | C-3-3 | | | 15 | | | | | | |
| Solvent (D) | D-1 | 1900 | 2100 | 1900 | 2000 | 2100 | 2000 | 2100 | 1900 | 2000 |
| (parts by weight) | D-2 | 875 | 900 | 900 | 800 | 1000 | 800 | 900 | 875 | 800 |
| Pigment (E) | E-1-1 | 125 | | | 220 | | 130 | | | 220 |
| (parts by weight) | E-1-2 | | 150 | | | 250 | | | 200 | |
| | E-1-3 | | | 200 | | | 250 | 45 | 250 | |
| | E-2-1 | | | | 30 | | | 220 | | 30 |
| | E-2-2 | | | | | 30 | | | | |
| | E-3-1 | 125 | | | 100 | | 60 | 60 | | 100 |
| | E-3-2 | | 100 | | | 30 | | | 120 | |
| Photo-Initiating Agent (C-1)/Photo-Initiating Agent (C-2) (% by weight/% by weight) | | 20/80 | 30/70 | 40/60 | 50/50 | 60/40 | 70/30 | 80/20 | 20/80 | 50/50 |
| Rate of Change of Viscosity (%) | | 8 | 7 | 6 | 5 | 6 | 7 | 8 | 8 | 12 |
| Evaluation Results | Pigment Agglutination | ○ | ○ | ○ | ○ | ○ | ○ | ○ | ○ | Δ |
| | Undercutting | ○ | ○ | ○ | ○ | ○ | ○ | ○ | ○ | Δ |
| | Development Properties | ◎ | ◎ | ○ | ◎ | ○ | ○ | ◎ | ◎ | Δ |
| | Contrast | ○ | ○ | ○ | ○ | ○ | ○ | Δ | ○ | ○ |
| | Brightness | ○ | ○ | ○ | ○ | ○ | ○ | Δ | ○ | ○ |
| | Film Thickness Homogeneity | ○ | ○ | ○ | ○ | ○ | ○ | ○ | ○ | Δ |

| Constituents | | Comparative Examples | | | | | | | |
|---|---|---|---|---|---|---|---|---|---|
| | | 1 | 2 | 3 | 4 | 5 | 6 | 7 | 8 |
| Alkali Soluble Resin (A) | A-1 | 100 | | | 50 | 50 | 50 | 50 | 50 |
| (parts by weight) | A-2 | | 100 | | 50 | 50 | 50 | 50 | 50 |
| | A-3 | | | 100 | | | | | |
| Compound Containing | B-1 | 100 | 50 | 100 | 90 | 90 | 90 | 90 | 90 |
| Ethylenically Unsaturated | B-2 | | 30 | | | | | | |
| Groups (B) (parts by weight) | | | | | | | | | |
| Photo-Initiating Agent (C) | C-1-1 | 30 | 30 | | | | | | |
| (parts by weight) | C-1-2 | | | | 20 | | 60 | 54 | 6 |
| | C-2-1 | 30 | | 20 | | | | | |
| | C-2-2 | | | | 30 | | | 6 | 54 | 60 |
| | C-3-1 | | 15 | 10 | | 30 | 15 | | 15 | |
| | C-3-2 | | | | | 20 | | | | |
| | C-3-3 | | | | | 20 | | | | |
| Solvent (D) | D-1 | 1900 | 2100 | 1900 | 2000 | 2000 | 2000 | 2000 | 2000 |
| (parts by weight) | D-2 | 900 | 900 | 900 | 800 | 800 | 800 | 800 | 800 |
| Pigment (E) | E-1-1 | | | | 220 | 220 | 220 | 220 | 220 |
| (parts by weight) | E-1-2 | | | | | | | | |
| | E-1-3 | | | | | | | | |
| | E-2-1 | 320 | | 220 | 30 | 30 | 30 | 30 | 30 |
| | E-2-2 | | 300 | | | | | | |
| | E-3-1 | | | | 100 | 100 | 100 | 100 | 100 |
| | E-3-2 | | | 100 | | | | | |

TABLE 2-continued

Constituent Proportions and Evaluation Results of Examples and
Comparative Examples of the Photosensitive Resin Composition

| | | | | | | | | | |
|---|---|---|---|---|---|---|---|---|---|
| Photo-Initiating Agent (C-1)/Photo-Initiating Agent (C-2) (% by weight/% by weight) | | 50/50 | 60/40 | 40/60 | 0/0 | 100/0 | 90/10 | 10/90 | 0/100 |
| Rate of Change of Viscosity (%) | | 6 | 7 | 7 | 30 | 28 | 25 | 7 | 5 |
| Evaluation Results | Pigment Agglutination | ○ | ○ | ○ | X | X | X | ○ | ○ |
| | Undercutting | ○ | ○ | ○ | X | X | X | ○ | ○ |
| | Development Properties | ◎ | ◎ | ○ | X | ◎ | ◎ | X | X |
| | Contrast | X | X | X | ○ | ○ | ○ | ○ | ○ |
| | Brightness | X | X | X | ○ | ○ | ○ | ○ | ○ |
| | Film Thickness Homogeneity | ○ | ○ | ○ | X | X | X | ○ | ○ |

B-1 DPHA: dipentaerythritol hexaacrylate (manufactured by Toagosei Ltd.)
B-2 T0-1382 dipentaerythritol heptaacrylate (1 carboxyl group and 5 ethylenically unsaturated groups are in the same molecule (manufactured by Toagosei Ltd.))
C-1-1 1-[9-ethyl-6-(2-methylbenzoyl)-9H-carbazole-3-yl]-ethanone 1-(0-benzoyloxime)
C-1-2 1-[4-(phenylthio)phenyl]-octane-1,2-dione 2-(0-benzoyloxime)
C-2-1 4-[m-bromo-p-N,N-di(ethoxycarbonylmethyl)aminophenyl]-2,6-di(trichloromethyl)-s-triazine
C-2-2 2,4-Bis(trichloromethyl)-6-(p-methoxy)styryl-s-triazine
C-3-1 2,2'-Bis(2,4-dichlorophenyl)-4,4',5,5'-tetraphenyl-1,2'-biimidazole
C-3-2 2-Benzyl-2-N,N-dimethylamino-1-(4-morpholinophenyl)-1-butanone
C-3-3 4,4'-bis(diethylamino)benzophenone
D-1 ethyl-3-ethoxy propionate
D-2 propylene glycol methyl ether acetate
E-1-1 M: Ga·Y: Cl · m = 1 · Chlorine atom: $X_2$-$X_3$-$X_6$-$X_7$-$X_{10}$-$X_{11}$-$X_{14}$-$X_{15}$-Hydrogen atom: $X_1$-$X_4$-$X_5$-$X_8$-$X_9$-$X_{12}$-$X_{13}$-$X_{16}$
E-1-2 M: Zn · m = 0 · Bromine atom: $X_1$-$X_2$-$X_4$-$X_5$-$X_6$-$X_8$-$X_9$-$X_{10}$-$X_{12}$-$X_{13}$-$X_{14}$-$X_{16}$-Chlorine atom: $X_3$-$X_7$-$X_{11}$-$X_{15}$
E-1-3 M: Zn · m = 0 · Bromine atom: $X_1$-$X_2$-$X_4$-$X_5$-$X_6$-$X_8$-$X_9$-$X_{10}$-$X_{12}$-$X_{13}$-$X_{14}$-$X_{16}$-Chlorine atom: -$X_3$-$X_7$-$X_{11}$-Hydrogen atom: $X_{15}$
E-2-1 C.I.G07
E-2-2 C.I.G36
E-3-1 C.I.Y138
E-3-2 C.I.Y150

What is claimed is:

1. A photosensitive resin composition for color filter, comprising:
an alkali-soluble resin (A);
a photopolymerizable monomer (B);
a photoinitiator (C);
an organic solvent (D); and
a pigment (E);
wherein said pigment (E) comprises a halogenated phthalocyanine compound (E-1) represented by the following Formula (1);

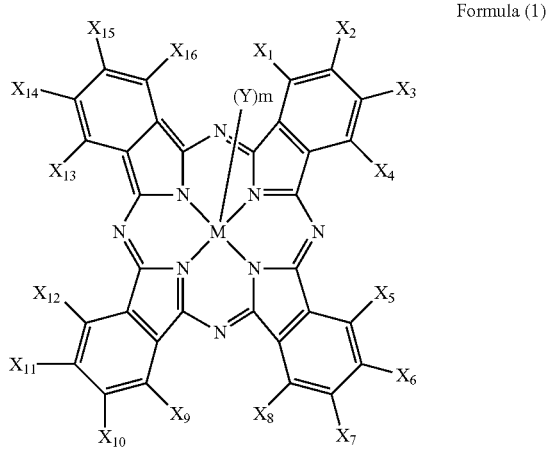

Formula (1)

wherein M is Al, Si, Sc, Ti, V, Fe, Co, Ni, Zn, Ga, Ge, Y, Zr, Nb, In, Sn or Pb; $X_1$~$X_{16}$ are hydrogen atoms or halogen atoms, and the halogen atoms are fluorine atoms, chlorine atoms, bromine atoms or iodine atoms; the total number of halogen atoms is an integer between 8~16; Y are fluorine atoms, chlorine atoms, bromine atoms, iodine atoms, oxygen atoms or hydroxyl groups; and m is an integer between 0~2; and said photoinitiator (C) comprises an O-acyloxime photoinitiator (C-1) and a triazine photoinitiator (C-2), and the proportion by weight of the photoinitiator (C-1) and the photoinitiator (C-2) is 20/80~80/20; based on 100% by weight as the total weight of the photoinitiator (C), the total dosage of the photoinitiator (C-1) and the photoinitiator (C-2) is between 40~100% by weight.

2. The photosensitive resin composition for color filter of claim 1, wherein the rate of change of viscosity of said composition stored at a temperature of 45° C. for 7 days is below 10% relative to the initial viscosity.

3. The photosensitive resin composition for color filter of claim 1, wherein, based on 100 parts by weight of said alkali-soluble resin (A), the dosage of the halogenated phthalocyanine compound (E-1) is 50~500 parts by weight.

4. The photosensitive resin composition for color filter of claim 1, wherein the proportion by weight of the O-acyloxime photoinitiator (C-1) and the triazine photoinitiator (C-2) is 25/75~75/25.

5. The photosensitive resin composition for color filter of claim 4, wherein the proportion by weight of the O-acyloxime photoinitiator (C-1) and the triazine photoinitiator (C-2) is 30/70~70/30.

6. The photosensitive resin composition for color filter of claim 1, wherein said alkali-soluble resin (A) is formed by copolymerization of 5-50 parts by weight of an ethylenically unsaturated monomer (a-1) containing at least one carboxylic acid group and 95~50 parts by weight of other copolymerizable ethylenically unsaturated monomers (a-2); based on 100 parts by weight of total said monomer (a-1) and (a-2).

7. The photosensitive resin composition for color filter of claim 6, wherein said ethylenically unsaturated monomer (a-1) containing at least one carboxylic acid group and selected from the group including acrylic acid, methylacrylic acid, 2-methylcryloylethoxy succinate and 2-methacryloylethoxy succinate.

8. A color filter, comprising pixel layers, wherein the pixel layers are formed using the photosensitive resin composition for color filter as claimed in claim 1.

9. A liquid display element, the liquid display element comprising the color filter as claimed in claim 8.

* * * * *